United States Patent
Terasaki et al.

(10) Patent No.: US 10,103,035 B2
(45) Date of Patent: Oct. 16, 2018

(54) COPPER-CERAMIC BONDED BODY AND POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/117,935

(22) PCT Filed: Feb. 12, 2015

(86) PCT No.: PCT/JP2015/053792
§ 371 (c)(1),
(2) Date: Aug. 10, 2016

(87) PCT Pub. No.: WO2015/122446
PCT Pub. Date: Aug. 20, 2015

(65) Prior Publication Data
US 2016/0358791 A1 Dec. 8, 2016

(30) Foreign Application Priority Data

Feb. 12, 2014 (JP) .................. 2014-024410
Mar. 14, 2014 (JP) .................. 2014-052594
Jul. 2, 2014 (JP) .................. 2014-136567

(51) Int. Cl.
*H01L 21/48* (2006.01)
*H01L 23/00* (2006.01)
(Continued)

(52) U.S. Cl.
CPC ........ *H01L 21/4807* (2013.01); *C04B 37/025* (2013.01); *C04B 37/026* (2013.01);
(Continued)

(58) Field of Classification Search
None
See application file for complete search history.

(56) References Cited

U.S. PATENT DOCUMENTS 5,326,623 A 7/1994 Yamakawa et al.
5,648,123 A * 7/1997 Kuhn .................. C04B 41/009
427/309

(Continued)

FOREIGN PATENT DOCUMENTS

CN 1146390 A 4/1997
JP 63-239166 A 10/1988
(Continued)

OTHER PUBLICATIONS

Jarrige et.al. J. Europ. Ceram. Soc., 27, 2007 855-860.*
(Continued)

*Primary Examiner* — Vera Katz
(74) *Attorney, Agent, or Firm* — Locke Lord LLP; James E. Armstrong, IV; Nicholas J. DiCeglie, Jr.

(57) ABSTRACT

There is a provided a copper-ceramic bonded body in which a copper member formed of copper or a copper alloy and a ceramic member formed of nitride ceramic are bonded to each other, in which an active element oxide layer containing an active element and oxygen is formed at bonding interfaces between the copper member and the ceramic member, and a thickness t of the active element oxide layer is in a range of 5 nm to 220 nm.

4 Claims, 11 Drawing Sheets

(51) Int. Cl.
  *H01L 23/14* (2006.01)
  *H01L 23/373* (2006.01)
  *H05K 1/09* (2006.01)
  *C04B 37/02* (2006.01)
  *H01L 23/473* (2006.01)
  *H01L 23/15* (2006.01)

(52) U.S. Cl.
  CPC ........ *H01L 21/4871* (2013.01); *H01L 23/142* (2013.01); *H01L 23/3735* (2013.01); *H01L 23/473* (2013.01); *H01L 24/32* (2013.01); *H05K 1/09* (2013.01); *C04B 2235/6581* (2013.01); *C04B 2235/72* (2013.01); *C04B 2237/068* (2013.01); *C04B 2237/121* (2013.01); *C04B 2237/126* (2013.01); *C04B 2237/343* (2013.01); *C04B 2237/345* (2013.01); *C04B 2237/346* (2013.01); *C04B 2237/366* (2013.01); *C04B 2237/368* (2013.01); *C04B 2237/38* (2013.01); *C04B 2237/407* (2013.01); *C04B 2237/60* (2013.01); *C04B 2237/704* (2013.01); *C04B 2237/706* (2013.01); *C04B 2237/708* (2013.01); *H01L 23/15* (2013.01); *H01L 2224/32225* (2013.01); *H01L 2224/32505* (2013.01); *H01L 2924/014* (2013.01); *H01L 2924/0105* (2013.01); *H01L 2924/01079* (2013.01)

(56) References Cited

U.S. PATENT DOCUMENTS

| | | | |
|---|---|---|---|
| 6,310,775 | B1 | 10/2001 | Nagatomo et al. |
| 2012/0261657 | A1* | 10/2012 | Takahashi ........... H01L 29/7869 257/43 |
| 2013/0042912 | A1* | 2/2013 | Kurihara .............. B23K 35/262 136/256 |

FOREIGN PATENT DOCUMENTS

| | | |
|---|---|---|
| JP | 04-162756 A | 6/1992 |
| JP | 04-295065 A | 10/1992 |
| JP | 05-070259 A | 3/1993 |
| JP | 06-024854 A | 2/1994 |
| JP | 08-139420 A | 5/1996 |
| JP | 3211856 B2 | 9/2001 |
| JP | 2006-240955 A | 9/2006 |
| JP | 2011-181846 A | 9/2011 |
| JP | 2013-049589 A | 3/2013 |
| JP | 2013-098387 A | 5/2013 |
| WO | 2009/139472 A1 | 11/2009 |

OTHER PUBLICATIONS

Entezarian et.al. Mat. Sci. & Eng. A212, 1996, 206-212.*
Kara-Slimane et.al. J. Europ. Ceram. Soc. 20, 2000, 1829-1836.*
International Search Report dated Mar. 31, 2015, issued for PCT/JP2015/053792 and English translation thereof.
Notice of Allowance dated Sep. 15, 2015, issued for Japanese patent application No. 2014-052594 and English translation thereof.
Tong Xiao-yu, "Preliminary Analysis of Attenuator Seal Technology and Mechanism for High Power Coupled Cavity TWTs," Vacuum Electronics, No. 4, 2004, pp. 7-9. and English translation thereof
Office Action dated Feb. 15, 2017, issued for the Chinese patent application No. 201580008014.0 and English translation thereof.
Notice of Allowance dated Sep. 20, 2016, issued for the Taiwanese patent application No. 104104739 and an English translation of the Search Report.
Supplementary European Search Report dated Nov. 7, 2017, issued for the European patent application No. 5749540.9.

* cited by examiner

COPPER-CERAMIC BONDED BODY AND POWER MODULE SUBSTRATE

TECHNICAL FIELD

The present invention relates to a copper-ceramic bonded body obtained by bonding a copper member formed of copper or a copper alloy and a ceramic member to each other, and a power module substrate formed of this copper-ceramic bonded body.

Priority is claimed on Japanese Patent Application No. 2014-024410, filed Feb. 12, 2014, Japanese Patent Application No. 2014-052594, filed Mar. 14, 2014, and Japanese Patent Application No. 2014-136567, filed Jul. 2, 2014, the content of which is incorporated herein by reference.

BACKGROUND ART

A semiconductor device such as an LED or a power module has a structure in which a semiconductor element is bonded onto a circuit layer formed of a conductive material.

In a power semiconductor element for controlling the high power used for controlling wind power generation, electric cars, and hybrid cars, since the power semiconductor element has a significant heating value, a power module substrate including a ceramic substrate formed of AlN (aluminum nitride) or $Al_2O_3$ (alumina) and a circuit layer formed by bonding a metal plate having excellent conductivity to one surface of this ceramic substrate has been widely used as a substrate for mounting the power semiconductor element, in the related art. A substrate in which a metal layer is formed by bonding the metal plate to the other surface of the ceramic substrate is also proposed as a power module substrate.

Patent Document 1, for example, discloses a power module substrate in which a first metal plate and a second metal plate configuring a circuit layer and a metal layer are set as copper plates and the copper plates are directly bonded to a ceramic substrate by a direct bonding copper (DBC) method. In this DBC method, the generation of liquid phases is caused at interfaces between the copper plates and the ceramic substrate using a eutectic reaction between copper and copper oxide, and the copper plates and the ceramic substrate are bonded to each other.

In addition, Patent Document 2 discloses a power module substrate in which a circuit layer and a metal layer are formed by bonding copper plates to one surface and the other surface of a ceramic substrate. In this power module substrate, the copper plates are bonded to one surface and the other surface of the ceramic substrate by arranging the copper plates with a Ag—Cu—Ti-based brazing material interposed between the ceramic substrate and the copper plates and performing heating treatment (so-called an active metal brazing method). In this active metal brazing method, since a brazing material containing Ti which is an active metal is used, wettability of a melted brazing material and the ceramic substrate is improved and the ceramic substrate and the copper plates are successfully bonded to each other.

CITATION LIST

Patent Document

[Patent Document 1] Japanese Unexamined Patent Application, First Publication No. H04-162756
[Patent Document 2] Japanese Patent No. 3211856

DISCLOSURE OF INVENTION

Technical Problem

However, as disclosed in Patent Document 1, in a case of bonding the ceramic substrate and the copper plates by the DBC method, it is necessary to set a bonding temperature to equal to or higher than 1065° C. (equal to or higher than a eutectic point temperature of copper and a copper oxide), and accordingly, the ceramic substrate may have degraded at the time of bonding.

In addition, as disclosed in Patent Document 2, in a case of bonding the ceramic substrate and the copper plates by the active metal brazing method, the bonding temperature is set as a comparatively high temperature which is 900° C., and accordingly, the ceramic substrate may be degraded. Here, when the bonding temperature is decreased, the brazing material does not sufficiently react with the ceramic substrate such that a decrease in a bonding rate is caused at the interfaces between the ceramic substrate and the copper plates, and a power module substrate having high reliability may not be provided.

Further, in the active metal brazing method, a TiN layer is formed at bonding interfaces between the ceramic substrate and the copper plates. Since this TiN layer is hard and brittle, cracks may be generated on the ceramic substrates during hot-cold cycle loading.

In a case where the ceramic substrate formed of alumina and the copper plates are bonded to each other by the active metal brazing method, a thick Ti oxide layer is formed at the bonding interfaces between the ceramic substrate and the copper plates. Since this Ti oxide layer is hard and brittle, cracks may be generated on the ceramic substrate during hot-cold cycle loading.

A first aspect of the present invention is made in consideration of the aforementioned circumstances, and an object thereof is to provide a copper-ceramic bonded body in which a copper member formed of copper or a copper alloy and a ceramic member formed of nitride ceramic are reliably bonded to each other, and a power module substrate formed of the copper-ceramic bonded body.

A second aspect of the present invention is made in consideration of the aforementioned circumstances, and an object thereof is to provide a copper-ceramic bonded body in which a copper member formed of copper or a copper alloy and a ceramic member formed of alumina are reliably bonded to each other, and a power module substrate formed of the copper-ceramic bonded body.

Solution to Problem

[First Aspect]
In order to solve the aforementioned problems and achieve the object, there is provided a copper-ceramic bonded body of a first aspect of the present invention in which a copper member formed of copper or a copper alloy and a ceramic member formed of nitride ceramic are bonded to each other, in which an active element oxide layer containing an active element and oxygen is formed at bonding interfaces between the copper member and the ceramic member, and a thickness of the active element oxide layer is in a range of 5 nm to 220 nm.

In the copper-ceramic bonded body having this configuration, the active element oxide layer containing an active element and oxygen is formed at the bonding interfaces between the copper member formed of copper or a copper alloy and the ceramic member formed of nitride ceramic. In the first aspect, since the thickness of the active element oxide layer is equal to or greater than 5 nm, the ceramic member and the copper member are reliably bonded to each other and it is possible to ensure bonding strength. In addition, since the thickness of the active element oxide layer is equal to or smaller than 220 nm, the thickness of the comparatively hard and brittle active element oxide layer is small, and it is possible to prevent generation of cracks on the ceramic member due to thermal stress during hot-cold cycle loading, for example.

Herein, in a case where the copper member and the ceramic member formed of nitride ceramic are bonded to each other with an active element interposed therebetween under conditions of maintaining a high temperature, the active element and nitrogen of the nitride ceramic react with each other and a nitride layer is formed. In the first aspect, it is possible to form an active element oxide layer, instead of a nitride layer, by bonding the copper member and the ceramic member formed of nitride ceramic under conditions of a low temperature. The active element oxide layer is formed by a reaction between the active element interposed between the copper member and the ceramic member and oxygen contained in an oxide formed on the surface of the copper member or the ceramic member or a bonding material.

In the first aspect, Ti, Zr, Hf, Nb, or the like can be used as the active element. AlN, $Si_3N_4$, or the like can be used as the nitride ceramic.

In the copper-ceramic bonded body of the first aspect, the active element oxide layer may contain P.

In this case, when P is interposed in the bonding interfaces, P is bonded to the active element and reacts with oxygen, and accordingly, an active element oxide layer containing P is easily formed on the surface of the ceramic member. Therefore, it is possible to reliably bond the copper member and the ceramic member to each other at a low temperature. Thus, it is possible to prevent thermal deterioration of the ceramic member at the time of bonding.

In the copper-ceramic bonded body of the first aspect, a Cu—Al eutectic layer may be formed between the active element oxide layer and the copper member.

In this case, it is possible to reliably bond the copper member and the ceramic member under the conditions of a low temperature by interposing Al in the bonding interfaces. At this time, the Cu—Al eutectic layer is formed between the active element oxide layer and the copper member described above with a reaction between Al and Cu.

A power module substrate of the first aspect is configured with the copper-ceramic bonded body; and in the copper-ceramic bonded body, a copper plate formed of copper or a copper alloy is bonded to a surface of a ceramic substrate formed of nitride ceramic.

Since the power module substrate having this configuration is configured with the copper-ceramic bonded body described above, it is possible to reduce a thermal load applied to the ceramic substrate by performing the bonding under the conditions of a low temperature and to prevent degradation of the ceramic substrate. In addition, even in a case where the bonding is performed under the conditions of a low temperature, the ceramic substrate and the copper plate are reliably bonded to each other and it is possible to ensure bond reliability. The copper plate bonded to the surface of the ceramic substrate is used as a circuit layer or a metal layer.

[Second Aspect]

In order to solve the aforementioned problems and achieve the body, there is provided a copper-ceramic bonded body of a second aspect of the present invention in which a copper member formed of copper or a copper alloy and a ceramic member formed of alumina are bonded to each other, in which an active element oxide layer containing an active element, oxygen, and phosphorous is formed at bonding interfaces between the copper member and the ceramic member, and a thickness of the active element oxide layer is in a range of 5 nm to 220 nm.

In the copper-ceramic bonded body having this configuration, the active element oxide layer containing the active element, oxygen, and phosphorous is formed at the bonding interfaces between the copper member formed of copper or a copper alloy and the ceramic member formed of alumina. In the second aspect, since the thickness of the active element oxide layer is equal to or greater than 5 nm, the ceramic member and the copper member are reliably bonded to each other and it is possible to ensure bonding strength. In addition, since the thickness of the active element oxide layer is equal to or smaller than 220 nm, the thickness of the comparatively hard and brittle active element oxide layer is small, and it is possible to prevent generation of cracks on the ceramic member due to thermal stress during hot-cold cycle loading, for example.

Herein, in a case where the copper member and the ceramic member formed of alumina are bonded to each other with an active element interposed therebetween under conditions of maintaining a high temperature, the active element and oxygen of alumina react with each other and a thick oxide layer is formed. In the second aspect, it is possible to form a comparatively thin active element oxide layer, by bonding the copper member and the ceramic member formed of alumina under conditions of a low temperature.

When phosphorous (P) is interposed in the bonding interfaces, phosphorous (P) is bonded to the active element and reacts with oxygen, and accordingly, an active element oxide layer containing phosphorous (P) is easily formed on the surface of the ceramic member. Therefore, it is possible to reliably bond the copper member and the ceramic member to each other under the conditions of a low temperature. Thus, it is possible to prevent thermal deterioration of the ceramic member at the time of bonding.

In the second aspect, Ti, Zr, Hf, or the like can be used as the active metal. 92% alumina ($Al_2O_3$ purity equal to or greater than 92 mass %), 96% alumina ($Al_2O_3$ purity equal to or greater than 96 mass %), 98% alumina ($Al_2O_3$ purity equal to or greater than 98 mass %), zirconia-toughened alumina, or the like can be used as the alumina.

In the copper-ceramic bonded body of the second aspect, the phosphorous concentration of the active element oxide layer may be in a range of 1.5 mass % to 10 mass %.

In this case, since the phosphorous concentration (P concentration) of the active element oxide layer is equal to or greater than 1.5 mass %, it is possible to reliably form the active element oxide layer even under the conditions of a low temperature and to strongly bond the copper member and the ceramic member to each other. Since the phosphorous concentration (P concentration) of the active element oxide layer is equal to or smaller than 10 mass %, the active element oxide layer does not become excessively hard, and it is possible to prevent generation of cracks on the ceramic member due to thermal stress during hot-cold cycle loading, for example.

A power module substrate of the second aspect is configured with the copper-ceramic bonded body; and in the copper-ceramic bonded body, a copper plate formed of copper or a copper alloy is bonded to a surface of a ceramic substrate formed of alumina.

Since the power module substrate having this configuration is configured with the copper-ceramic bonded body described above, it is possible to reduce a thermal load applied to the ceramic substrate by performing the bonding under the conditions of a low temperature and to prevent degradation of the ceramic substrate. In addition, even in a case where the bonding is performed under the conditions of a low temperature, the ceramic substrate and the copper plate are reliably bonded to each other and it is possible to ensure bond reliability. The copper plate bonded to the surface of the ceramic substrate is used as a circuit layer or a metal layer.

Advantageous Effects of Invention

According to the first aspect of the present invention, it is possible to provide a copper-ceramic bonded body in which a copper member formed of copper or a copper alloy and a ceramic member formed of nitride ceramic are reliably bonded to each other, and a power module substrate formed of the copper-ceramic bonded body.

According to the second aspect of the present invention, it is possible to provide a copper-ceramic bonded body in which a copper member formed of copper or a copper alloy and a ceramic member formed of alumina are reliably bonded to each other, and a power module substrate formed of the copper-ceramic bonded body.

BEST MODE FOR CARRYING OUT THE INVENTION

First Aspect

First Embodiment

Hereinafter, the first embodiment according to the first aspect of the present invention will be described with reference to the accompanied drawings.

A copper-ceramic bonded body according to the first embodiment of the present invention is set as a power module substrate 10 configured by bonding a ceramic substrate 11 as a ceramic member formed of a nitride ceramic and a copper plate 22 (circuit layer 12) as a copper member formed of copper or a copper alloy to each other.

Figure 1:
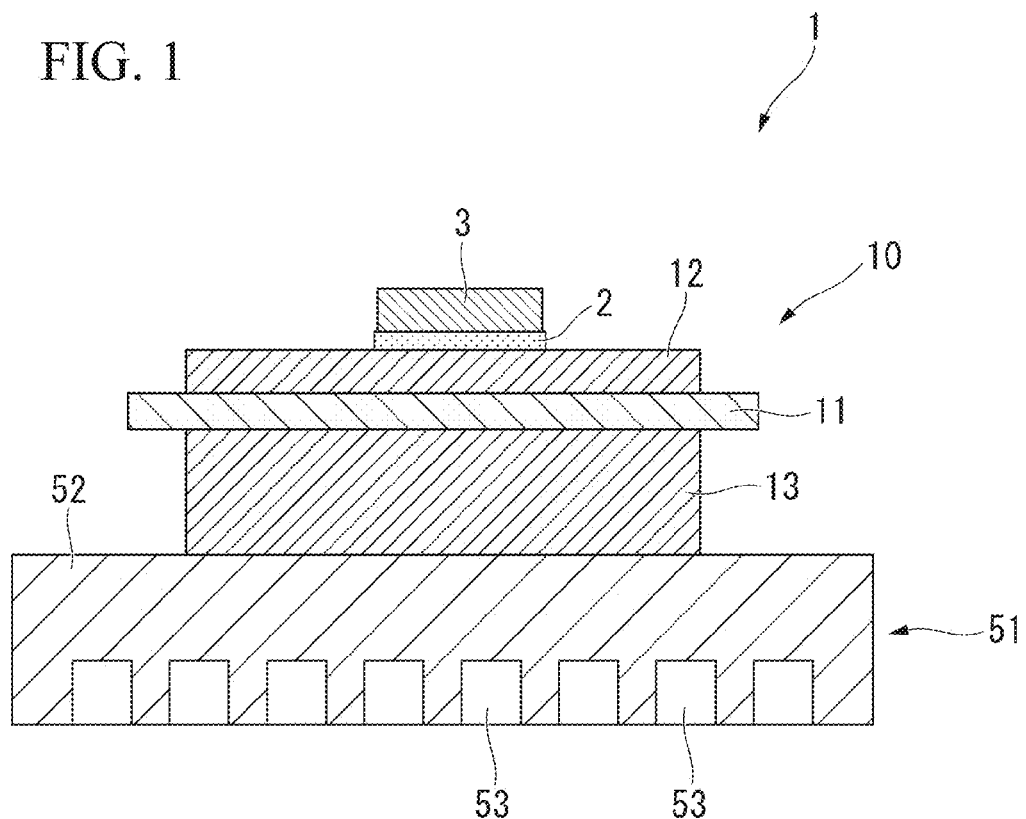
FIG. 1 is a schematic explanatory diagram of a power module using a power module substrate of a first embodiment of the present invention.

FIG. 1 shows the power module substrate 10 of the first embodiment of the present invention and a power module 1 using this power module substrate 10.

The power module 1 includes the power module substrate 10, a semiconductor element 3 bonded to a surface of one side (upper side in FIG. 1) of the power module substrate 10 through a solder layer 2, and a heat sink 51 disposed on the other side (lower side in FIG. 1) of the power module substrate 10.

Here, the solder layer 2 is, for example, a Sn—Ag-based, a Sn—In-based or Sn—Ag—Cu-based soldering material.

The power module substrate 10 includes the ceramic substrate 11, the circuit layer 12 installed on one surface (upper surface in FIG. 1) of the ceramic substrate 11, and a metal layer 13 installed on the other surface (lower surface in FIG. 1) of the ceramic substrate 11.

The ceramic substrate 11 prevents electric connection between the circuit layer 12 and the metal layer 13 and the ceramic substrate 11 of the first embodiment is configured with AlN (aluminum nitride) which is one kind of nitride ceramic. Herein, a thickness of the ceramic substrate 11 is preferably set in a range of 0.2 mm to 1.5 mm and is set to 0.635 mm in the first embodiment.

Figure 4:
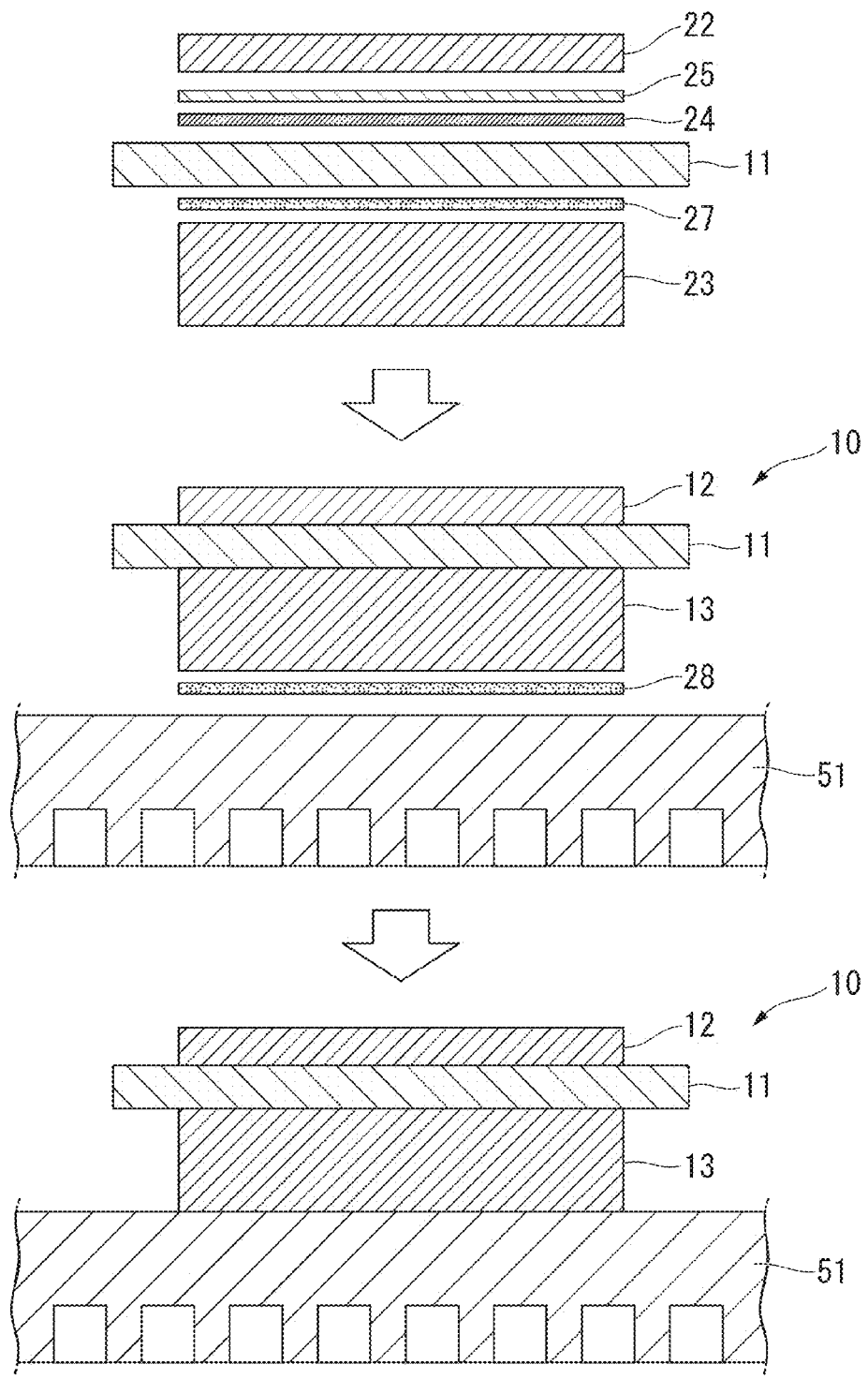
FIG. 4 is an explanatory diagram showing the manufacturing method of the power module substrate of the first embodiment of the present invention.

As shown in FIG. 4, the circuit layer 12 is formed by bonding the copper plate 22 formed of copper or a copper alloy to one surface of the ceramic substrate 11. In the first embodiment, a rolled plate of oxygen-free copper is used as the copper plate 22 configuring the circuit layer 12. A circuit pattern is formed in this circuit layer 12 and the one surface (upper surface in FIG. 1) is set as a mounted surface where the semiconductor element 3 is mounted. Herein, a thickness of the circuit layer 12 is preferably set in a range of 0.1 mm to 1.0 mm and is set to 0.6 mm in the first embodiment.

As shown in FIG. 4, the metal layer 13 is formed by bonding an aluminum plate 23 to the other surface of the ceramic substrate 11. In the first embodiment, the metal layer 13 is formed by bonding the aluminum plate 23 formed of a rolled plate of aluminum having purity equal to or greater than 99.99 mass % (so-called 4N aluminum) to the ceramic substrate 11.

A 0.2% bearing force of the aluminum plate 23 is preferably equal to or smaller than 30 N/mm². Here, a thickness of the metal layer 13 (aluminum plate 23) is preferably set in a range of 0.5 mm to 6 mm and is set to 2.0 mm in the first embodiment.

The heat sink 51 is for cooling the power module substrate 10 described above and includes a top plate part 52 bonded to the power module substrate 10 and flow paths 53 for causing a cooling medium (for example, cooling water) to flow. The heat sink 51 (plate part 52) is desirably configured with a material having excellent thermal conductivity and is configured with A6063 (aluminum alloy) in the first embodiment.

In the first embodiment, the heat sink 51 (plate part 52) is directly bonded to the metal layer 13 of the power module substrate 10 by brazing.

Figure 2:
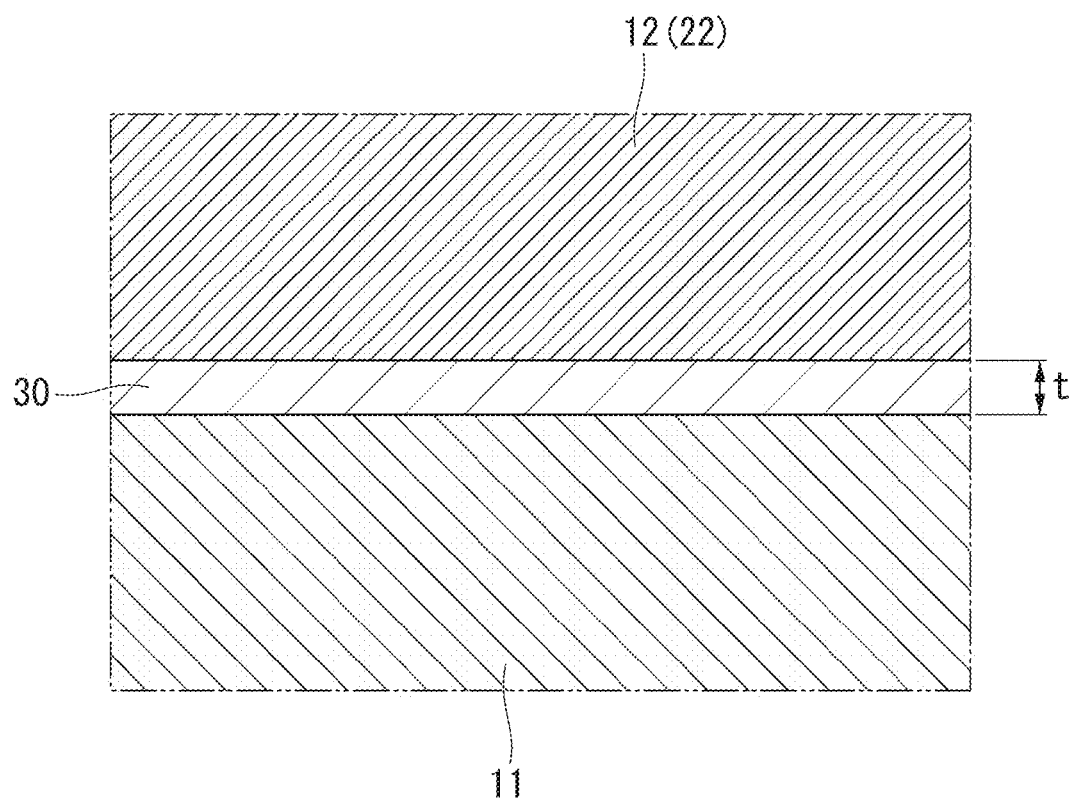
FIG. 2 is a schematic view of bonding interfaces between a circuit layer (copper member) and a ceramic substrate (ceramic member) of the power module substrate of the first embodiment of the present invention.

Here, as shown in FIG. 2, an active element oxide layer 30 containing an active element and oxygen is formed at the bonding interfaces between the ceramic substrate 11 and the circuit layer 12 (copper plate 22). In the first embodiment, a thickness t of the active element oxide layer 30 is set to be in a range of 5 nm to 220 nm. The thickness t of the active element oxide layer 30 is preferably from 10 nm to 220 nm and is more preferably from 10 nm to 50 nm. The concentration of the active element of the active element oxide layer 30 is in a range of 35 at % to 70 at %. The concentration of the active element herein is concentration when the total content of the active element, P, and O is 100.

In the first embodiment, Ti is used as the active element, and the active element oxide layer 30 is set as a Ti—O layer containing Ti and oxygen.

In the first embodiment, as will be described later, since the ceramic substrate 11 and the circuit layer 12 (copper plate 22) are bonded to each other using a Cu—P-based brazing material 24 containing P, the active element oxide layer 30 contains P. In the first embodiment, the content of P of the active element oxide layer 30 is preferably in a range of 1.5 mass % to 10 mass % and more preferably in a range of 3 mass % to 8 mass %. The content of P herein is content when the total content of Ti, P, and O is 100.

Since the content of P is equal to or greater than 1.5 mass %, it is possible to reliably form the active element oxide layer 30 and to reliably bond the ceramic substrate 11 and the circuit layer 12 to each other. In addition, since the content of P is equal to or smaller than 10 mass %, the active element oxide layer 30 does not become excessively hard, and it is possible to decrease the load applied to the ceramic substrate due to thermal stress during cold-hot cycling loading, for example, and to prevent a decrease in reliability of the bonding interfaces.

In a case of bonding the ceramic substrate 11 and the circuit layer 12 (copper plate 22) to each other without using the Cu—P-based brazing material 24 containing P, a Cu—Al brazing material which will be described later can be used as the brazing material 24.

The thickness t of the active element oxide layer 30 is measured by observing the bonding interfaces with magnification of 200000 using a transmission electron microscope and assuming a portion having concentration of the active element in a range of 35 at % to 70 at % as the active element oxide layer 30. The concentration (at %) of the active element is measured by an energy dispersive X-ray spectrometer (EDS) attached to the transmission electron microscope and is set as concentration of the active element when the total of P concentration, active element concentration, and O concentration is 100. An average value of 5 viewing fields is set as the thickness of the active element oxide layer.

For the content (mass %) of P of the active element oxide layer 30, the P concentration (mass %), the Ti concentration (mass %), and O concentration (mass %) in the active element oxide layer 30 are measured by the EDS attached to the transmission electron microscope and the P concentration (mass %) is calculated, when the total of the P concentration, the Ti concentration, and the O concentration is 100. The measurement points are set as 5 points and an average value thereof is set as the content (mass %) of P.

Figure 3:
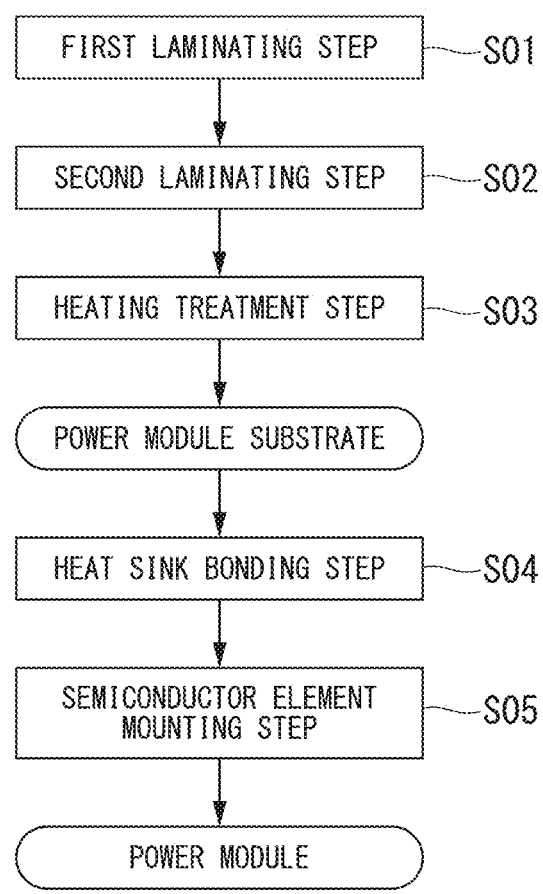
FIG. 3 is a flowchart showing a manufacturing method of the power module substrate of the first embodiment of the present invention.

Next, a manufacturing method of the power module substrate 10 of the first embodiment described above will be described with reference to FIG. 3 and FIG. 4.

First, as shown in FIG. 4, the Cu—P-based brazing material 24, a Ti material 25 (active element material), and the copper plate 22 to be the circuit layer 12 are laminated on one surface (upper surface in FIG. 4) of the ceramic substrate 11 in order (first laminating Step S01), and the Al plate 23 to be the metal layer 13 is laminated on the other surface (lower surface in FIG. 4) of the ceramic substrate 11 in order with a bonding material 27 interposed therebetween (second laminating Step S02).

Herein, in the first embodiment, it is preferable that a Cu—P—Sn—Ni brazing material containing 3 mass % to 10 mass % of P, 7 mass % to 50 mass % of Sn which is a low-melting-point element, and 2 mass % to 15 mass % of Ni is used as the Cu—P-based brazing material 24. A thickness of the Cu—P-based brazing material 24 is preferably in a range of 5 µm to 50 µm.

In addition, a Cu—P—Zn brazing material or the like can be used as the Cu—P-based brazing material 24.

In the first embodiment, a thickness of the Ti material 25 is preferably in range of 0.1 µm to 25 µm and a Ti foil having a thickness of 12 µm is used in the first embodiment. In a case where the thickness is 0.1 µm to 0.5, the Ti material 25 is preferably formed as a film by vapor deposition or sputtering, and in a case where the thickness is equal to or greater than 0.5 µm, a foil material is preferably used.

In the first embodiment, a Al—Si-based brazing material (for example, Al-7.5 mass % Si brazing material) containing Si as a melting-point decreasing element is preferably used as the bonding material 27 which bonds the aluminum plate 23 to the ceramic substrate 11.

In addition, an Al—Cu brazing material or Cu can be used as the bonding material 27. In a case where Cu (for example, fixed amount is from 0.08 mg/cm$^2$ to 2.7 mg/cm$^2$) is used as the bonding material 27, bonding can be performed by transient liquid phase diffusion bonding (TLP).

Next, the ceramic substrate 11, the Cu—P-based brazing material 24, the Ti foil 25, the copper plate 22, the bonding material 27, and the Al plate 23 are charged and heated in a vacuum heating furnace, in a state of being pressurized (pressure of 1 kgf/cm$^2$ to 35 kgf/cm$^2$) in a laminating direction (heating treatment Step S03). In the first embodiment, the pressure in the vacuum heating furnace is set in a range of $10^{-6}$ Pa to $10^{-3}$ Pa, the heating temperature is set in a range of 600° C. to 650° C., and the holding time is set in a range of 30 minutes to 360 minutes.

The power module substrate 10 of the first embodiment is manufactured in Steps S01 to S03 described above.

Next, the heat sink 51 is bonded to the other surface side of the metal layer 13 of the power module substrate 10 (heat sink bonding Step S04).

The power module substrate 10 and the heat sink 51 are laminated with a brazing material 28 interposed therebetween, pressurized in a laminating direction, and charged in a vacuum furnace to perform brazing. Accordingly, the metal layer 13 of the power module substrate 10 and the top plate part 52 of the heat sink 51 are bonded to each other. At this time, an Al—Si-based brazing material foil (for example, Al-10 mass % Si brazing material foil) having a thickness of 20 µm to 110 µm can be used as the brazing material 28, for example, and the brazing temperature is set to a temperature lower than the temperature condition in the heating treatment Step S03.

Next, the semiconductor element 3 is bonded to one surface of the circuit layer 12 of the power module substrate 10 by soldering (semiconductor element mounting Step S05).

The power module 1 shown in FIG. 1 is manufactured in Steps S01 to S05 described above.

Herein, in the heating treatment Step S03, Ti of the Ti foil 25, P of the Cu—P-based brazing material 24, oxygen existing in the ceramic substrate 11 or the Cu—P-based brazing material 24 react with each other in the bonding interfaces between the ceramic substrate 11 and the copper plate 22, and the active element oxide layer 30 (Ti—O layer) containing P is formed. An oxide existing in the surface of the ceramic substrate 11 or an oxide contained in the Ti foil 25 or the Cu—P-based brazing material 24 is used, for example, as oxygen existing in the ceramic substrate 11 or the Cu—P-based brazing material 24.

According to the copper-ceramic bonded body (power module substrate 10) of the first embodiment having the configuration described above, since the copper plate 22 (circuit layer 12) formed of oxygen-free copper and the ceramic substrate 11 formed of AlN are bonded to each other with the Cu—P-based brazing material 24 and the Ti foil 25 interposed therebetween, and the active element oxide layer 30 (Ti—O layer) is formed at the bonding interfaces between the ceramic substrate 11 and the copper plate 22 (circuit layer 12), the ceramic substrate 11 and the circuit layer 12 are strongly bonded to each other.

In the first embodiment, since the thickness t of the active element oxide layer 30 (Ti—O layer) is set to be equal to or greater than 5 nm, the ceramic substrate 11 and the copper plate 22 (circuit layer 12) are reliably bonded to each other and it is possible to ensure bonding strength thereof. In addition, since the thickness t of the active element oxide layer 30 (Ti—O layer) is set to be equal to or smaller than 220 nm, it is possible to prevent generation of cracks on the ceramic substrate 11 due to thermal stress during hot-cold cycling loading.

In order to exhibit the operation effects described above, the thickness t of the active element oxide layer 30 (Ti—O layer) is preferably from 10 nm to 220 nm.

The concentration of the active element (Ti in the first embodiment) of the active element oxide layer 30 is set in a range of 35 at % to 70 at %. The concentration of the active element herein is concentration when the total content of the active element (Ti in the first embodiment), P, and O is 100.

In the first embodiment, since the bonding is performed using the Cu—P-based brazing material 24, P of the Cu—P-based brazing material 24 and Ti of the Ti foil 25 react with each other and further react with oxygen, and accordingly, it is possible to reliably form the active element oxide layer 30 (Ti—O layer) containing P. Accordingly, it is possible to reliably bond the ceramic substrate 11 and the copper plate 22 (circuit layer 12) to each other. That is, P which is an element easily reacting with Ti used as an active element and which is the element easily reacting with oxygen is interposed in the interface, and accordingly, the formation of the active element oxide layer 30 (Ti—O layer) described above is promoted and the ceramic substrate 11 and the copper plate 22 are reliably bonded to each other under the conditions of a low temperature.

In a case where the ceramic substrate 11 formed of AlN and the copper plate 22 are held at a high temperature with Ti interposed therebetween (for example, 790° C. to 850° C.), nitrogen in the ceramic substrate 11 and Ti react with each other and TiN is formed. However, in the first embodiment, since the condition of a low temperature (range of 600° C. to 650° C.) is set in the heating treatment Step S03, the active element oxide layer 30 (Ti—O layer) is formed without forming TiN.

In the first embodiment, as described above, the ceramic substrate 11 and the copper plate 22 can be bonded to each other under the conditions of a low temperature, and accordingly, the ceramic substrate 11 and the copper plate 22 are bonded to each other and the ceramic substrate 11 and the aluminum plate 23 are bonded to each other at the same time in the heating treatment Step S03, in the first embodiment. Therefore, it is possible to significantly improve manufacturing efficiency of the power module substrate 10 and to reduce the manufacturing cost. Since the copper plate 22 and the aluminum plate 23 are bonded to both surfaces of the ceramic substrate 11 at the same time, it is possible to prevent generation of a warp of the ceramic substrate 11 at the time of bonding.

Second Embodiment

Next, a second embodiment according to the first aspect of the present invention will be described with reference to the accompanied drawings.

A copper-ceramic bonded body according to the second embodiment of the present invention is a power module substrate configured by bonding the ceramic substrate 11 as a ceramic member formed of a nitride ceramic and the copper plate 22 (circuit layer 12) as a copper member formed of copper or a copper alloy to each other, in the same manner as in the first embodiment, and a structure of the bonding interfaces between the ceramic substrate 11 and the copper plate 22 (circuit layer 12) is different from the power module substrate shown in FIG. 1.

Figure 5:
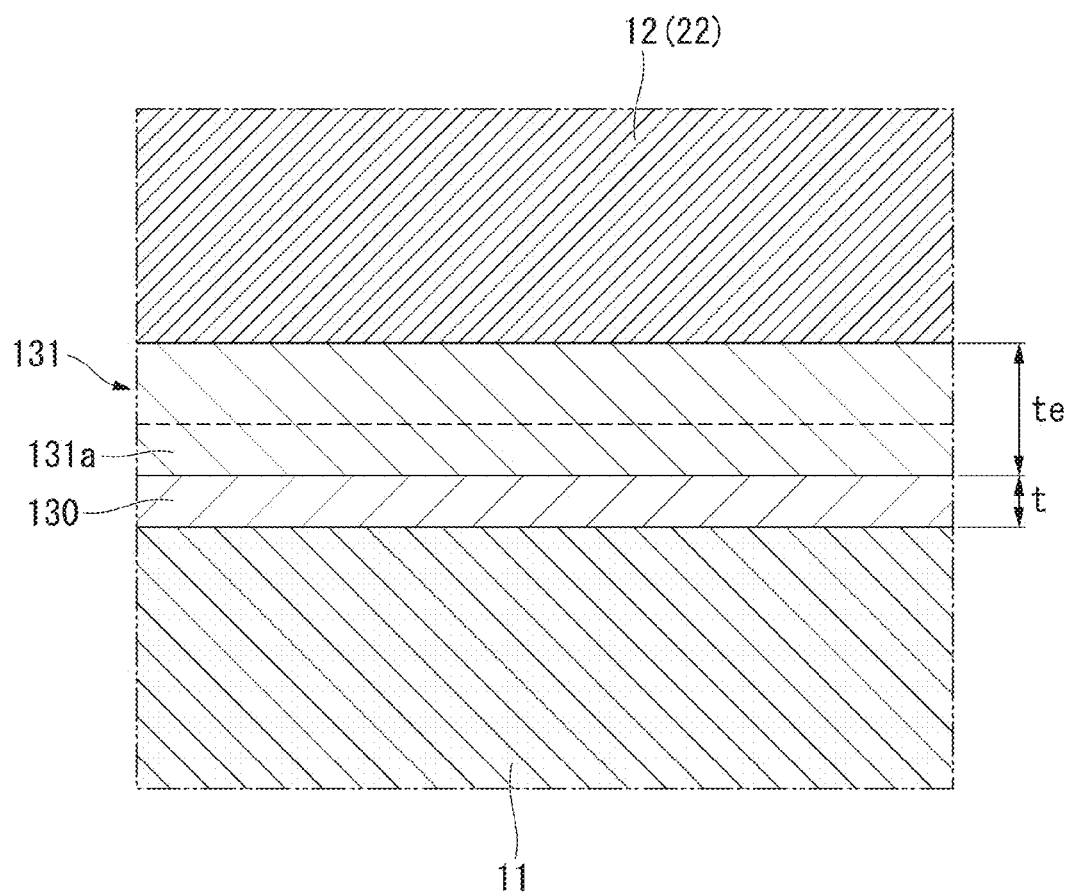
FIG. 5 is a schematic view of bonding interfaces between a circuit layer (copper member) and a ceramic substrate (ceramic member) of the power module substrate of a second embodiment of the present invention.

FIG. 5 shows a structure of the bonding interfaces between the ceramic substrate 11 and the copper plate 22 (circuit layer 12) of the second embodiment of the present invention.

In the second embodiment, as shown in FIG. 5, an active element oxide layer 130 containing an active element and oxygen and a Cu—Al eutectic layer 131 are laminated and disposed at the bonding interfaces between the ceramic substrate 11 and the circuit layer 12 (copper plate 22). That is, the Cu—Al eutectic layer 131 is formed between the active element oxide layer 130 and the copper plate 22 (circuit layer 12).

Herein, in the second embodiment, a thickness t of the active element oxide layer 130 is in a range of 5 nm to 220 nm, is preferably in a range of 10 nm to 220 nm, and more preferably in a range of 10 nm to 50 nm. In the second embodiment, Ti is included as the active element, and the active element oxide layer 130 is a Ti—O layer containing Ti and oxygen.

In the second embodiment, a thickness to of the Cu—Al eutectic layer 131 is preferably in a range of 10 μm to 60 μm and more preferably in a range of 10 μm to 30 μm. The Cu—Al eutectic layer 131 may include an active element thickened layer 131a obtained by thickening the active element (Ti in the second embodiment) on the active element oxide layer 130 side.

The concentration of the active element of the active element oxide layer 130 is in a range of 35 at % to 70 at %.

A Cu—Al eutectic layer is a portion having a composition in which the Cu concentration is 60 at % to 90 at % when the total of the Cu concentration and the Al concentration is 100 at %.

The concentration of the active element of the active element thickened layer 131a is preferably in a range of 40 at % to 60 at % and more preferably in a range of 50 at % to 60 at %. The thickness of the active element thickened layer 131a is preferably in a range of 10 nm to 200 nm and more preferably in a range of 10 nm to 50 nm.

The concentration and the thickness of the active element of the active element oxide layer 130 are measured by the same method as the concentration and the thickness of the active element of the active element oxide layer 30 of the first embodiment.

For the thickness of the Cu—Al eutectic layer, the thicknesses of five portions having a composition in which the Cu concentration is 60 at % to 90 at % when the total of the Cu concentration and the Al concentration is 100 at % are measured using the EDS attached to the transmission electron microscope and an average value thereof is acquired.

The composition of the active element thickened layer 131a is measured using the EDS attached to the transmission electron microscope.

The manufacturing method of the power module substrate of the second embodiment is different from the manufacturing method of the power module substrate of the first embodiment in that the Cu—Al-based brazing material is used instead of the Cu—P-based brazing material 24.

In the second embodiment, a Cu—Al-based brazing material containing Al in a range of 45 mass % to 95 mass % is used as the Cu—Al-based brazing material. In addition, the thickness of the Cu—Al-based brazing material is preferably in a range of 5 μm to 50 μm.

The heating temperature at the time of bonding is desirably from 580° C. to 650° C.

In the second embodiment, the ceramic substrate 11 and the circuit layer 12 (copper plate 22) are bonded to each other using the Cu—Al-based brazing material containing Al and Al in this Cu—Al-based brazing material is subjected to a eutectic reaction with Cu, and thus, the generation of liquid phases is caused under the conditions of a low temperature and the Cu—Al eutectic layer 131 described above is formed.

According to the copper-ceramic bonded body (power module substrate) of the second embodiment having the configuration described above, since the active element oxide layer 130 (Ti—O layer) is formed at the bonding interfaces between the ceramic substrate 11 and the copper plate 22 (circuit layer 12), the ceramic substrate 11 and the circuit layer 12 are strongly bonded to each other.

Furthermore, since the Cu—Al eutectic layer 131 is formed between the active element oxide layer 130 and the copper plate 22 (circuit layer 12), the generation of liquid phases is caused by a eutectic reaction under the conditions of a low temperature, and it is possible to reliably bond the ceramic substrate 11 and the circuit layer 12.

Herein, since the thickness to of the Cu—Al eutectic layer 131 is equal to or greater than 10 μm, the liquid phases are sufficiently formed as described above, and it is possible to reliably bond the ceramic substrate 11 and the circuit layer 12. Since the thickness to of the Cu—Al eutectic layer 131 is equal to or smaller than 60 μm, it is possible to prevent a portion around the bonding interfaces from being brittle and to ensure high hot-cold cycle reliability.

Hereinabove, the first and second embodiments according to the first aspect of the present invention have been described, but the present invention is not limited thereto and can be suitably modified within a range not departing technical ideas of the present invention.

For example, the power module substrate in which the copper plate (circuit layer) as the copper member and the ceramic substrate as the ceramic member are bonded to each other has been described as an example, but there is no limitation and a copper-ceramic bonded body in which the copper member formed of copper or a copper alloy and the ceramic member formed of nitride ceramic are bonded to each other, may be used.

An example of forming the circuit layer by bonding the copper plate has been described, but there is no limitation and the metal layer may be formed by bonding the copper plate.

The copper plate has been described as the rolled plate of oxygen-free copper or tough pitch copper, but there is no limitation and the copper plate may be configured with other copper or copper alloy.

The aluminum plate configuring the metal layer has been described as the rolled plate of pure aluminum having purity of 99.99 mass %, but there is no limitation and the aluminum plate may be configured with other aluminum or aluminum alloys such as aluminum having purity of 99 mass % (2N aluminum).

The metal layer is not limited to a layer configured with an aluminum plate and may be configured with other metal.

AlN has been described as the nitride ceramic, but there is no limitation and other nitride ceramic such as $Si_3N_4$ may be used.

Ti has been described as the active element, but there is no limitation and other active elements such as Zr, Hf, or Nb may be used.

In the first and second embodiments of the present invention, an example in which P is contained in the active element oxide layer formed at the bonding interfaces has been described, but there is no limitation.

In the first and second embodiments of the present invention, an example in which the ceramic substrate and the copper plate are bonded to each other using the Cu—P—Sn—Ni-based brazing material and the Cu—Al-based brazing material has been described, but there is no limitation and other brazing materials may be used.

In the first and second embodiments of the present invention, an example in which the Cu—P—Sn—Ni-based brazing material, the Cu—Al-based brazing material, and the Ti foil are interposed between the ceramic substrate and the copper plate has been described, but there is no limitation and Cu—P—Sn—Ni paste, Cu—Al paste, and Ti paste may be interposed.

In the first and second embodiments, an example in which the Ti foil is interposed has been described, but there is no limitation and hydrogenated Ti can be used. In this case, a method of directly interposing powder of hydrogenated Ti or a method of applying hydrogenated Ti paste can be used. Not only the hydrogenated Ti, a hydride of other active elements such as Zr, Hf, or Nb can be used.

The heat sink is not limited to the example in the first and second embodiments of the present invention and there is no particular limitation to the structure of the heat sink.

A buffer layer formed of aluminum, an aluminum alloy, or a composite material (for example, AlSiC or the like) containing aluminum may be provided between the top plate part or a radiator plate of the heat sink and the metal layer.

Second Aspect

Third Embodiment

Hereinafter, the third embodiment according to the second aspect of the present invention will be described with reference to the accompanied drawings.

The members having the same configuration as those in the first embodiment have the same reference numerals and detailed description will be omitted.

A copper-ceramic bonded body according to the third embodiment is a power module substrate 210 configured by bonding a ceramic substrate 211 as a ceramic member formed of alumina and the copper plate 22 (circuit layer 12) as a copper member formed of copper or a copper alloy to each other.

Figure 8:
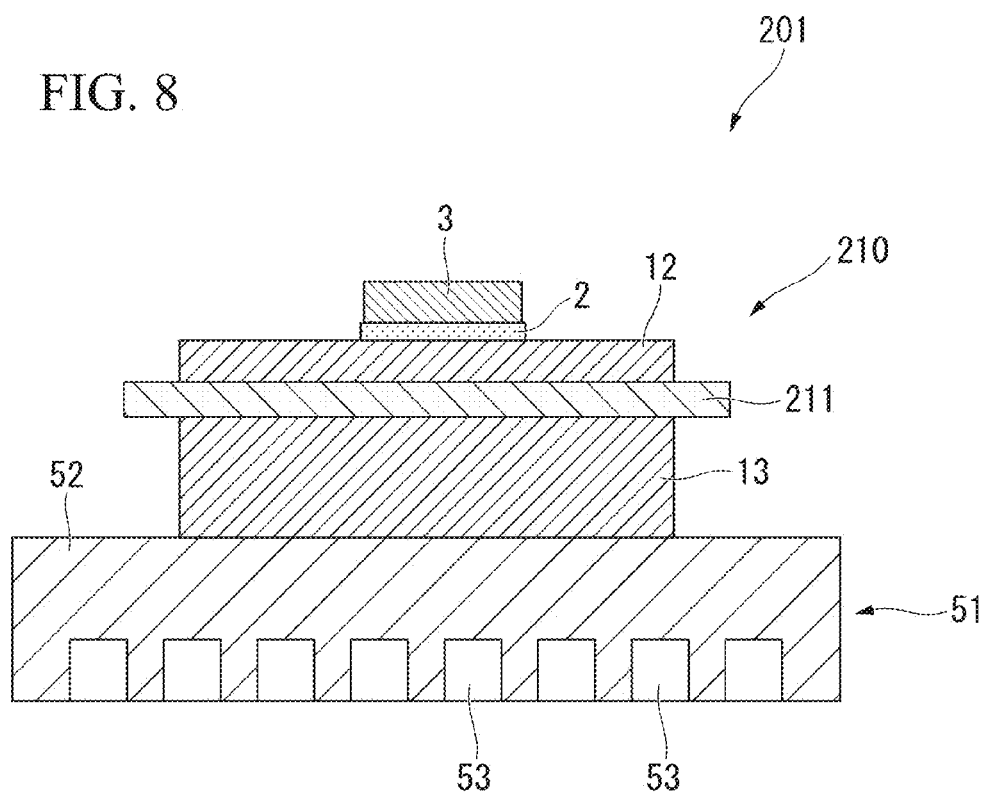
FIG. 8 is a schematic explanatory diagram of a power module using a power module substrate of a third embodiment of the present invention.

FIG. 8 shows the power module substrate 210 of the third embodiment of the present invention and a power module 201 using this power module substrate 210.

The power module 201 includes the power module substrate 210, the semiconductor element 3 bonded to a surface of one side (upper side in FIG. 8) of the power module substrate 210 through the solder layer 2, and the heat sink 51 disposed on the other side (lower side in FIG. 8) of the power module substrate 210.

In the solder layer 2, the same soldering material as that in the first embodiment can be used.

The power module substrate 210 includes the ceramic substrate 211, the circuit layer 12 installed on one surface (upper surface in FIG. 8) of the ceramic substrate 211, and the metal layer 13 installed on the other surface (lower surface in FIG. 8) of the ceramic substrate 211.

The ceramic substrate 211 prevents electric connection between the circuit layer 12 and the metal layer 13 and the ceramic substrate 211 of the third embodiment is configured with 98% alumina ($Al_2O_3$ purity equal to or greater than 98 mass %) which is one kind of alumina. Herein, a thickness of the ceramic substrate 211 is preferably set in a range of 0.2 mm to 1.5 mm and is set to 0.38 mm in the third embodiment.

Figure 10:
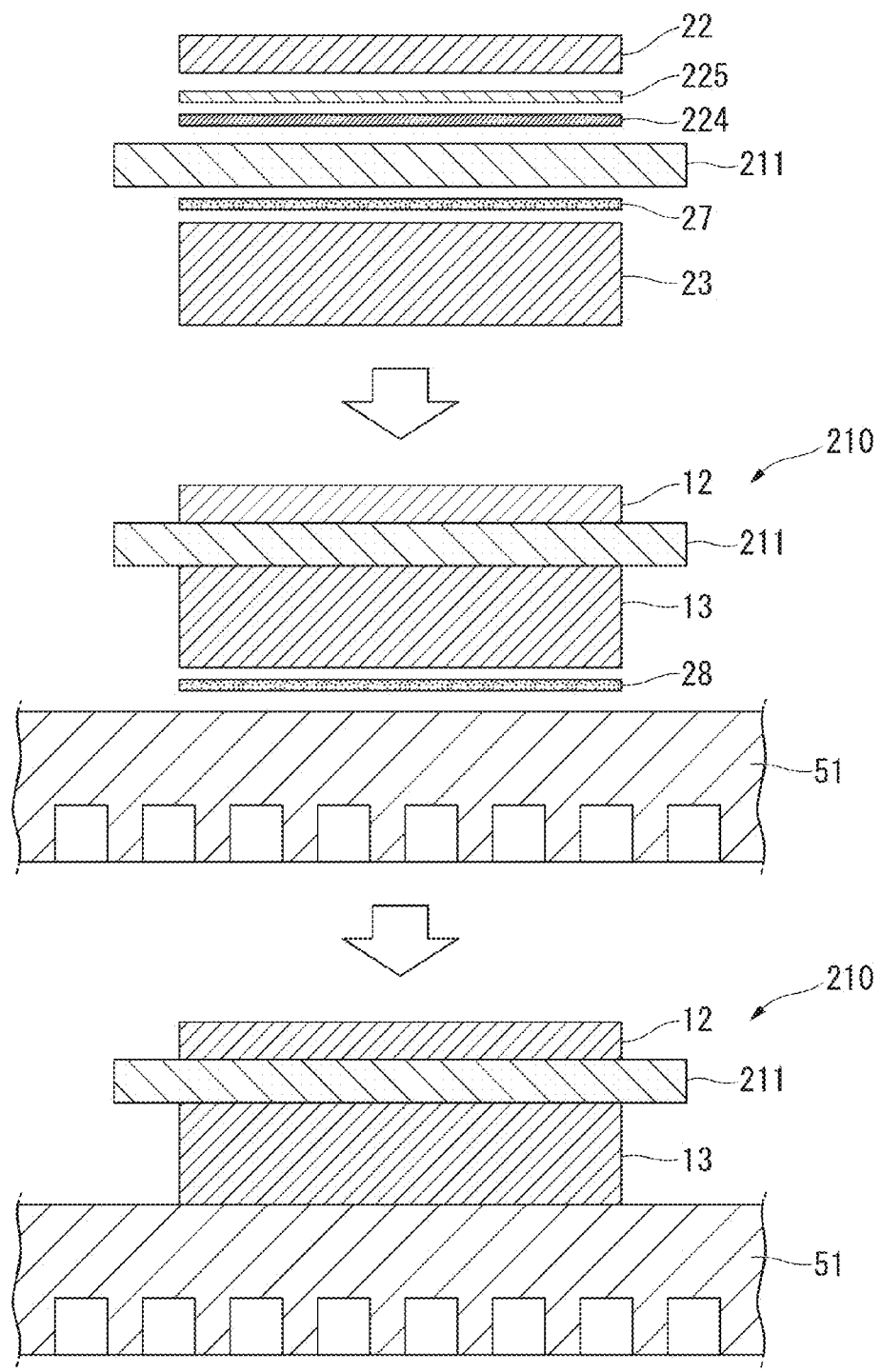
FIG. 10 is an explanatory diagram showing the manufacturing method of the power module substrate of the third embodiment of the present invention.

As shown in FIG. 10, the circuit layer 12 is formed by bonding the copper plate 22 formed of copper or a copper alloy to one surface of the ceramic substrate 211. In the third embodiment, the circuit layer 12 has the same configurations (the material, the usage, the thickness, and the like) as those of the circuit layer 12 of the first embodiment.

As shown in FIG. 10, the metal layer 13 is formed by bonding the aluminum plate 23 to the other surface of the ceramic substrate 211. In the third embodiment, the metal layer 13 is formed by bonding the aluminum plate 23 formed of a rolled plate of aluminum having purity equal to or greater than 99.99 mass % (so-called 4N aluminum) to the ceramic substrate 211.

The aluminum plate 23 of the third embodiment has the same configurations (the bearing force, the thickness, and the like) as those of the aluminum plate 23 of the first embodiment.

The heat sink 51 is for cooling the power module substrate 210 described above and has the same configurations (the structure, the material, the bonding method to the metal layer 13 of the power module substrate) as those of the heat sink 51 of the first embodiment, except the power module substrate 10 is the power module substrate 210.

Figure 9:
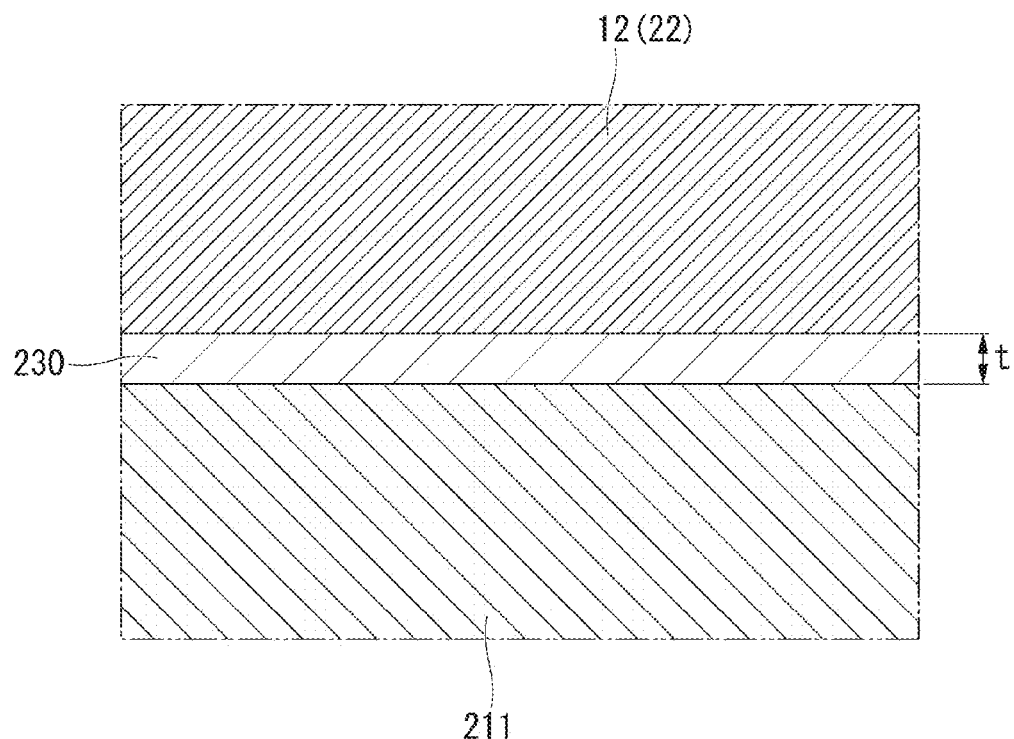
FIG. 9 is a schematic view of bonding interfaces between a circuit layer (copper member) and a ceramic substrate (ceramic member) of the power module substrate of the third embodiment of the present invention.

Here, as shown in FIG. 9, an active element oxide layer 230 containing an active element, oxygen, phosphorous is formed at the bonding interfaces between the ceramic substrate 211 and the circuit layer 12 (copper plate 22). In the third embodiment, a thickness t of the active element oxide layer 230 is set to be in a range of 5 nm to 220 nm. The thickness t of the active element oxide layer 230 is preferably from 10 nm to 220 nm and is more preferably from 10 nm to 50 nm.

In the third embodiment, Ti is included as the active element, and the active element oxide layer 230 described above is set as a Ti—P—O layer containing Ti, oxygen (O), and phosphorous (P).

In a case where Zr is used as the active element, the active element oxide layer 230 is a Zr—P—O layer, and in a case where Nb is used, the active element oxide layer 230 is a Nb—P—O layer, and in a case where Hf is used, the active element oxide layer 230 is a Hf—P—O layer.

The concentration of the active element of the active element oxide layer 230 is set to be in a range of 35 at % to 70 at %. The concentration of the active element herein is concentration when the total content of the active element, P, and O is 100.

In the third embodiment, the content of P of the active element oxide layer 230 is preferably in a range of 1.5 mass % to 10 mass % and more preferably in a range of 3 mass % to 8 mass %. The content of P herein is content when the total content of the active metal, P, and O is 100.

Since the content of P is equal to or greater than 1.5 mass %, it is possible to reliably form the active element oxide layer 230 and to reliably bond the ceramic substrate 211 and the circuit layer 12 to each other. In addition, since the content of P is equal to or smaller than 10 mass %, the active element oxide layer 230 does not become excessively hard, and it is possible to decrease the load applied to the ceramic substrate due to thermal stress during cold-hot cycling loading, for example, and to prevent a decrease in reliability of the bonding interfaces.

The concentration and the thickness of the active element and the P content of the active element oxide layer 230 are measured by the same method as the concentration and the thickness of the active element and the P content of the active element oxide layer 30 of the first embodiment.

Next, a manufacturing method of the power module substrate 210 of the third embodiment described above will be described with reference to FIG. 3 and FIG. 10.

First, as shown in FIG. 10, a Cu—P-based brazing material 224, a Ti foil 225, and the copper plate 22 to be the circuit layer 12 are laminated on one surface (upper surface in FIG. 10) of the ceramic substrate 211 in order (first laminating Step S01), and the Al plate 23 to be the metal layer 13 is laminated on the other surface (lower surface in FIG. 10) of the ceramic substrate 211 in order with the bonding material 27 interposed therebetween (second laminating Step S02).

Herein, in the third embodiment, it is preferable that a Cu—P—Sn—Ni brazing material containing 3 mass % to 10 mass % of P, 7 mass % to 50 mass % of Sn which is a low-melting-point element, and 2 mass % to 15 mass % of Ni is used as the Cu—P-based brazing material 224. A thickness of the Cu—P-based brazing material 224 is preferably in a range of 5 μm to 50 μm.

In addition, a Cu—P—Zn brazing material or the like can be used as the Cu—P-based brazing material 224.

In the third embodiment, a thickness of the Ti foil 225 is preferably in range of 0.5 μm to 25 μm and a Ti foil having a thickness of 12 μm is used in the third embodiment.

In the third embodiment, a Al—Si-based brazing material (for example, Al-7.5 mass % Si brazing material) containing Si as a melting-point decreasing element is preferably used as the bonding material 27 which bonds the aluminum plate 23 to the ceramic substrate 211. In addition, the same material as the brazing material used in the first embodiment can be used as the bonding material 27.

Next, the ceramic substrate 211, the Cu—P-based brazing material 224, the Ti foil 225, the copper plate 22, the bonding material 27, and the Al plate 23 are charged and heated in a vacuum heating furnace, in a state of being pressurized (pressure of 1 kgf/cm$^2$ to 35 kgf/cm$^2$) in a laminating direction (heating treatment Step S03). In the third embodiment, the pressure in the vacuum heating furnace is set in a range of 10$^{-6}$ Pa to 10$^{-3}$ Pa, the heating temperature is set in a range of 600° C. to 650° C., and the holding time is set in a range of 30 minutes to 360 minutes.

The power module substrate 210 of the third embodiment is manufactured in Steps S01 to S03 described above.

Next, the heat sink 51 is bonded to the other surface side of the metal layer 13 of the power module substrate 210 (heat sink bonding Step S04).

The power module substrate 210 and the heat sink 51 are laminated with the brazing material 28 interposed therebetween, pressurized in a laminating direction, and charged in a vacuum furnace to perform brazing. Accordingly, the metal layer 13 of the power module substrate 210 and the top plate part 52 of the heat sink 51 are bonded to each other. At this time, an Al—Si-based brazing material foil (for example, Al-10 mass % Si brazing material foil) having a thickness of 20 μm to 110 μm can be used as the brazing material 28, for example, and the brazing temperature is set to a temperature lower than the temperature condition in the heating treatment Step S03.

Next, the semiconductor element 3 is bonded to one surface of the circuit layer 12 of the power module substrate 210 by soldering (semiconductor element mounting Step S05).

The power module 201 shown in FIG. 8 is manufactured in Steps S01 to S05 described above.

Herein, in the heating treatment Step S03, Ti of the Ti foil 225, P of the Cu—P-based brazing material 224, oxygen existing in the ceramic substrate 211 or the Cu—P-based brazing material 224 react with each other in the bonding interfaces between the ceramic substrate 211 and the copper plate 22, and the active element oxide layer 30 (Ti—P—O layer) containing P is formed. An oxide in the surface of the ceramic substrate 211 or an oxide contained in the Ti foil 225 or the Cu—P-based brazing material 224 is used, for example, as oxygen existing in the ceramic substrate 211 or the Cu—P-based brazing material 224. In the third embodiment, since the heating treatment Step S03 is executed under the conditions of a low temperature, decomposition of alumina configuring the ceramic substrate 211 is prevented, the supply of oxygen from alumina is prevented, and it is possible to form the thin active element oxide layer 230.

According to the copper-ceramic bonded body (power module substrate 210) of the third embodiment having the configuration described above, since the copper plate 22 (circuit layer 12) formed of oxygen-free copper and the ceramic substrate 211 formed of alumina are bonded to each other with the Cu—P-based brazing material 224 and the Ti foil 225 interposed therebetween, and the active element oxide layer 230 (Ti—P—O layer) is formed at the bonding interfaces between the ceramic substrate 211 and the copper plate 22 (circuit layer 12), the ceramic substrate 211 and the circuit layer 12 are strongly bonded to each other.

In the third embodiment, since the thickness t of the active element oxide layer 230 (Ti—P—O layer) is set to be equal to or greater than 5 nm, the ceramic substrate 211 and the copper plate 22 (circuit layer 12) are reliably bonded to each other and it is possible to ensure bonding strength thereof. Meanwhile, since the thickness t of the active element oxide layer 230 (Ti—P—O layer) is set to be equal to or smaller than 220 nm, it is possible to prevent generation of cracks on the ceramic substrate 211 due to thermal stress during hot-cold cycling loading.

In order to exhibit the operation effects described above, the thickness t of the active element oxide layer 230 (Ti—P—O layer) is preferably from 10 nm to 220 nm.

In the third embodiment, since the bonding is performed using the Cu—P-based brazing material 224, P of the Cu—P-based brazing material 224 and Ti of the Ti foil 225 react with each other and further react with oxygen, and accordingly, it is possible to reliably form the active element oxide layer 230 (Ti—P—O layer) containing P.

Accordingly, it is possible to reliably bond the ceramic substrate 211 and the copper plate 22 (circuit layer 12) to each other. That is, P which is an element easily reacting with Ti used as an active element and which is the element easily reacting with oxygen is interposed in the interface, and accordingly, the formation of the active element oxide layer 230 (Ti—P—O layer) described above is promoted and the ceramic substrate 211 and the copper plate 22 are reliably bonded to each other under the conditions of a low temperature.

In a case where the ceramic substrate 211 formed of alumina and the copper plate 22 are held at a high temperature with Ti interposed therebetween (for example, 790° C. to 850° C.), oxygen in the ceramic substrate 211 and Ti react with each other and a thick Ti oxide layer is formed. However, in the third embodiment, since the condition of a low temperature (range of 600° C. to 650° C.) is set in the heating treatment Step S03, the active element oxide layer 230 (Ti—P—O layer) described above is formed to be comparatively thin.

In the third embodiment, as described above, the ceramic substrate 211 and the copper plate 22 can be bonded to each other under the conditions of a low temperature, and accordingly, the ceramic substrate 211 and the copper plate 22 are bonded to each other and the ceramic substrate 211 and the aluminum plate 23 are bonded to each other at the same time in the heating treatment Step S03, in the third embodiment. Therefore, it is possible to significantly improve manufacturing efficiency of the power module substrate 210 and to reduce the manufacturing cost. Since the copper plate 22 and the aluminum plate 23 are bonded to both surfaces of the ceramic substrate 211 at the same time, it is possible to prevent generation of a warp of the ceramic substrate 211 at the time of bonding.

Hereinabove, the third embodiment of the present invention has been described, but the present invention is not limited thereto and can be suitably modified within a range not departing technical ideas of the present invention.

For example, the power module substrate in which the copper plate (circuit layer) as the copper member and the ceramic substrate as the ceramic member are bonded to each other has been described as an example, but there is no limitation and a copper-ceramic bonded body in which the copper member formed of copper or a copper alloy and the ceramic member formed of alumina are bonded to each other, may be used.

An example of forming the circuit layer by bonding the copper plate has been described, but there is no limitation and the metal layer may be formed by bonding the copper plate.

The copper plate has been described as the rolled plate of oxygen-free copper or tough pitch copper, but there is no limitation and the copper plate may be configured with other copper or copper alloy.

The aluminum plate configuring the metal layer has been described as the rolled plate of pure aluminum having purity equal to or greater than 99.99 mass %, but there is no limitation and the aluminum plate may be configured with other aluminum or aluminum alloys such as aluminum having purity equal to or greater than 99 mass % (2N aluminum).

The metal layer is not limited to a layer configured with an aluminum plate and may be configured with other metal.

98% alumina ($Al_2O_3$ purity equal to or greater than 98 mass %) has been described as the nitride ceramic, but there is no limitation and other alumina such as 92% alumina ($Al_2O_3$ purity equal to or greater than 92 mass %), 96% alumina ($Al_2O_3$ purity equal to or greater than 96 mass %), or zirconia-toughened alumina may be used. Ti has been described as the active element, but there is no limitation and other active elements such as Zr or Hf may be used.

In the third embodiment, an example in which the ceramic substrate and the copper plate are bonded to each other using the Cu—P—Sn—Ni-based brazing material has been described, but there is no limitation and other brazing materials may be used.

In the third embodiment, an example in which the Cu—P—Sn—Ni-based brazing material and the Ti foil are interposed between the ceramic substrate and the copper plate has been described, but there is no limitation and Cu—P—Sn—Ni paste and Ti paste may be interposed.

The heat sink is not limited to the example in the third embodiment and there is no particular limitation to the structure of the heat sink.

A buffer layer formed of aluminum, an aluminum alloy, or a composite material (for example, AlSiC or the like) containing aluminum may be provided between the top plate part or a radiator plate of the heat sink and the metal layer.

EXAMPLES

Confirmation experiments performed for confirming effectiveness of the first embodiment and the second embodiment of the invention will be described.

Example 1

A copper-ceramic bonded body (power module substrate) was formed using a ceramic substrate, a brazing material, an active element, and a copper plate shown in Table 1.

More specifically, a copper plate (rolled plate of oxygen-free copper) having a size of 38 mm×38 mm and a thickness of 0.3 mm was laminated on one and the other surfaces of a ceramic substrate having a size of 40 mm×40 mm and a thickness of 0.635 mm with a brazing material and an active element shown in Table 1 interposed therebetween, and these components were charged and heated in a vacuum heating furnace (degree of vacuum of $5\times10^{-4}$ Pa) in a state of being pressurized at pressure of 6 kgf/cm² in a laminating direction to manufacture a power module substrate. The conditions of the heating treatment step are shown in Table 2.

In Example A4 of the invention, Cu-7 mass % P-15 mass % Sn-10 mass % Ni powder and paste formed of Ti powder were used as the brazing material and the active element. A coating thickness of the paste was set as 85 km.

Regarding the power module substrate obtained as described above, the bonding interfaces between the circuit layer (copper plate) and the ceramic substrate were observed and an initial bonding rate and a bonding rate after the hot-cold cycle were evaluated.

(Bonding Interface Observation)

The bonding interfaces between the copper plate and the ceramic substrate were observed using a transmission electron microscope (JEM-2010F manufactured by JEOL Ltd.)

Figure 6:
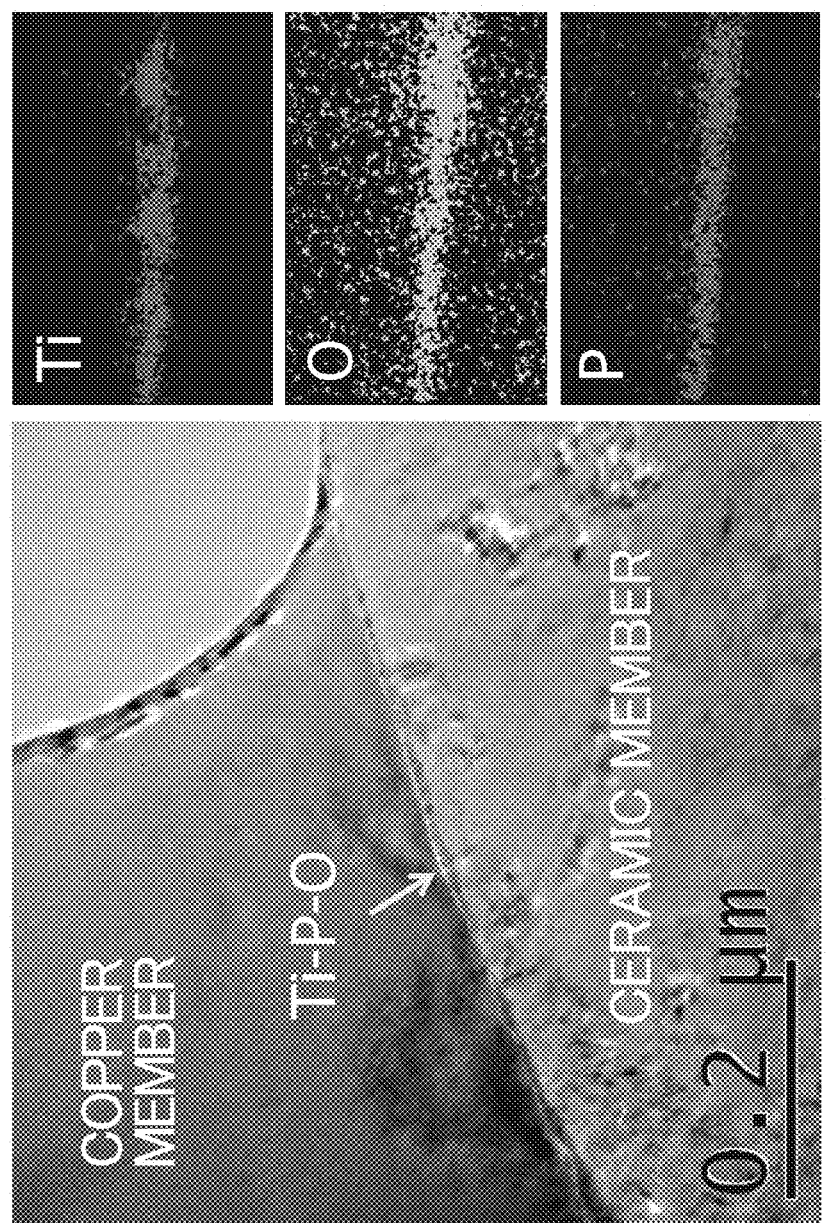
FIG. 6 is an observation image of bonding interfaces of a copper-ceramic bonded body (power module substrate) of Example A1 of the present invention.

The interface observation results of Example A1 of the invention and element mapping are shown in FIG. 6.

The thickness of the active element oxide layer was measured by observing the bonding interfaces with magnification of 200000 and assuming a portion having concentration of the active element in a range of 35 at % to 70 at % as the active element oxide layer. The P concentration (at %), the active element concentration (at %), and the O concentration (at %) were measured by the EDS attached to the transmission electron microscope and the concentration (at %) of the active element was set as concentration of the active element when the total of P concentration, active element concentration, and O concentration is 100. An average value of 5 viewing fields was set as the thickness of the active element oxide layer.

The P concentration (mass %), the Ti concentration (mass %), and O concentration (mass %) in the active element oxide layer were measured by the EDS attached to the transmission electron microscope, the P concentration when the total of the P concentration, the Ti concentration, and the O concentration was 100, was calculated, and the P concentration in the active element oxide layer was set as the P concentration (mass %). Five measurement points were used and an average value thereof was used as the P concentration.

The results are shown in Table 2.

(Hot-Cold Cycle Test)

In the hot-cold cycle test, 2000 cycles of −40° C.×5 min←→150° C.×5 min are executed with respect to the power module substrate with the liquid phase (Fluorinert) using a hot-cold shock testing device TSB-51 manufactured by ESPEC Corporation.

(Bonding Rate)

The bonding rate of the copper substrate and the ceramic substrate was acquired using the following equation using an ultrasonic test device. Herein, the initial bonding area was an area to be bonded before the bonding, that is, the area of the copper plate. Since the peeling is shown as a white portion in the bonded portion in an ultrasonic flaw detection image, the area of the white portion was used as the peeling area.

(bonding rate)={(initial bonding area)−(peeling area)}/(initial bonding area)

TABLE 1

| | Ceramic substrate | Brazing material | | Active element | |
| --- | --- | --- | --- | --- | --- |
| | | Composition | Thickness [μm] | Shape | Thickness [μm] |
| Example A1 of the invention | AlN | Cu-7mass % P-10mass % Sn-6.5mass % Ni | 20 | Ti foil | 25 |
| Example A2 of the invention | AlN | Cu-7mass % P-15mass % Sn-10mass % Ni | 20 | Ti foil | 0.6 |

TABLE 1-continued

|  | Ceramic substrate | Brazing material | | Active element | |
|---|---|---|---|---|---|
|  |  | Composition | Thickness [μm] | Shape | Thickness [μm] |
| Example A3 of the invention | AlN | Cu-7mass % P-15mass % Sn-10mass % Ni | 20 | Ti foil | 6 |
| Example A4 of the invention | AlN | Brazing material paste•Ti paste | | | |
| Example A5 of the invention | Si₃N₄ | Cu-7mass % P-15mass % Sn-10mass % Ni | 50 | Ti foil | 10 |
| Example A6 of the invention | Si₃N₄ | Cu-7mass % P-15mass % Sn-10mass % Ni | 50 | Ti foil | 10 |
| Example A7 of the invention | AlN | Cu-7mass % P-10mass % Sn-6.5mass % Ni | 20 | Ti vapor deposited film | 0.1 |
| Example A8 of the invention | Si₃N₄ | Cu-7mass % P-10mass % Sn-6.5mass % Ni | 20 | Ti vapor deposited film | 0.1 |
| Example A9 of the invention | AlN | Cu-50mass % Sn | 50 | Ti foil | 4 |
| Example A10 of the invention | AlN | Cu-7mass % P-15mass % Sn-10mass % Ni | 25 | Zr foil | 1 |
| Example A11 of the invention | AlN | Cu-7mass % P-15mass % Sn-10mass % Ni | 50 | Hf foil | 1 |
| Example A12 of the invention | AlN | Cu-7mass % P-15mass % Sn-10mass % Ni | 50 | Nb foil | 1 |
| Example A13 of the invention | AlN | Cu-7mass % P-15mass % Sn-10mass % Ni | 20 | Ti foil | 6 |
| Comparative Example A1 | AlN | Cu-7mass % P-15mass % Sn-10mass % Ni | 20 | Ti foil | 10 |
| Comparative Example A2 | AlN | Cu-7mass % P-15mass % Sn-10mass % Ni | 20 | Ti foil | 10 |
| Related Art Example A1 | AlN | Ag-28mass % Cu-3mass % Ti | 20 | — | — |

TABLE 2

|  | Heating treatment step | | Interface observation results | | | Bonding rate [%] | |
|---|---|---|---|---|---|---|---|
|  | Temperature [° C.] | Time [min] | Bonding interface | Thickness [nm] | P concentration | Initial | After hot-cold cycle |
| Example A1 of the invention | 630 | 30 | Active element oxide layer | 6 | 1.5 | 98.4 | 93.9 |
| Example A2 of the invention | 610 | 240 | Active element oxide layer | 10 | 3.1 | 98.8 | 94.1 |
| Example A3 of the invention | 650 | 180 | Active element oxide layer | 200 | 9.7 | 99.3 | 96.8 |
| Example A4 of the invention | 630 | 150 | Active element oxide layer | 100 | 5.7 | 99.1 | 95.6 |
| Example A5 of the invention | 630 | 180 | Active element oxide layer | 100 | 6.4 | 98.7 | 96.2 |
| Example A6 of the invention | 650 | 60 | Active element oxide layer | 100 | 6.2 | 99.1 | 94.6 |
| Example A7 of the invention | 650 | 120 | Active element oxide layer | 160 | 7.4 | 99.2 | 95.8 |
| Example A8 of the invention | 650 | 120 | Active element oxide layer | 140 | 7.1 | 98.1 | 94.9 |
| Example A9 of the invention | 650 | 60 | Active element oxide layer | 120 | 0 | 98.9 | 87.5 |
| Example A10 of the invention | 650 | 60 | Active element oxide layer | 150 | 8.3 | 98.4 | 96.9 |
| Example A11 of the invention | 650 | 60 | Active element oxide layer | 20 | 3.2 | 98.6 | 93.7 |
| Example A12 of the invention | 650 | 60 | Active element oxide layer | 40 | 4.3 | 98.2 | 94.2 |
| Example A13 of the invention | 650 | 210 | Active element oxide layer | 220 | 9.6 | 98.9 | 92.9 |
| Comparative Example A1 | 650 | 15 | Active element oxide layer | 2 | 1.1 | 80.1 | 58.4 |
| Comparative Example A2 | 650 | 400 | Active element oxide layer | 300 | 9.8 | 99.7 | Cracks in 1500 to 2000 |
| Related Art Example A1 | 650 | 30 | — | — | — | — | — |

The copper plate and the ceramic substrate were not bonded to each other in Related Art Example A1 in which the copper plate and the ceramic substrate were bonded using a Ag—Cu—Ti brazing material at a low temperature.

In Comparative Example A1 in which the thickness of the active element oxide layer is smaller than 5 nm, initial bonding rate was low and the bonding was insufficient.

In Comparative Example A2 in which the thickness of the active element oxide layer exceeds 220 nm, cracks were generated on the ceramic substrate after the hot-cold cycle. It is assumed that the thermal stress applied to the ceramic substrate is increased due to the formation of the thick active element oxide layer at the bonding interfaces.

With respect to this, in Example A1 to Example A13 of the invention in which the thickness of the active element oxide layer is from 5 nm to 220 nm, the initial bonding rate was high even under the conditions of a comparatively low temperature and the ceramic substrate and the copper plate were reliably bonded to each other. In addition, the bonding rate after the hot-cold cycle was high and the bond reliability was improved.

Example 2

A copper-ceramic bonded body (power module substrate) was formed using a ceramic substrate, a brazing material, an active element, and a copper plate shown in Table 3.

More specifically, a copper plate (rolled plate of oxygen-free copper) having a size of 38 mm×38 mm and a thickness of 0.3 mm was laminated on one and the other surfaces of a ceramic substrate having a size of 40 mm×40 mm and a thickness of 0.635 mm with a brazing material and an active element shown in Table 3 interposed therebetween, and these components were charged and heated in a vacuum heating furnace (degree of vacuum of $5 \times 10^{-4}$ Pa) in a state of being pressurized at pressure of 6 kgf/cm² in a laminating direction to manufacture a power module substrate. The conditions of the heating treatment step are shown in Table 4.

Regarding the power module substrate obtained as described above, the bonding interfaces between the circuit layer (copper plate) and the ceramic substrate were observed and an initial bonding rate and a bonding rate after the hot-cold cycle were evaluated. The evaluation method was the same as that in Example 1.

In the bonding interface observation, the thickness of the element oxide layer, and the thickness and the composition analysis of the Cu—Al eutectic layer were measured using the EDS attached to the transmission electron microscope.

A portion having a composition in which the Cu concentration is 60 at % to 90 at % when the total of the Cu concentration and the Al concentration is 100 at % was assumed as the Cu—Al eutectic layer and a thickness of the Cu—Al eutectic layer was measured.

Figure 7:
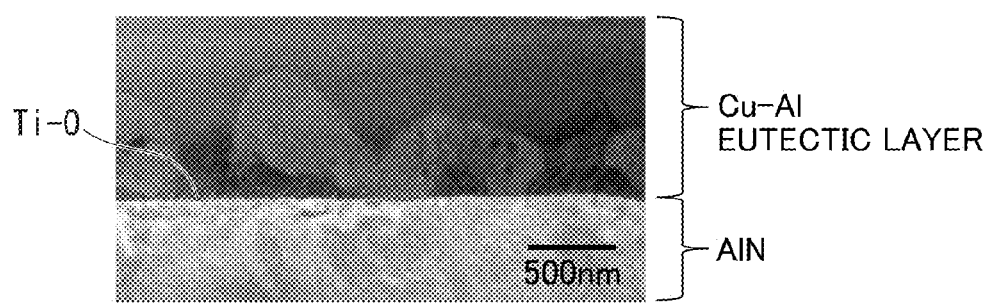
FIG. 7 is an observation image of bonding interfaces of a copper-ceramic bonded body (power module substrate) of Example A13 of the present invention.

In the composition of the Cu—Al eutectic layer, five measurement points were used and an average value thereof was set. The observation results are shown in FIG. 7. The evaluation results are shown in Table 4.

the thickness of the Cu—Al eutectic layer is from 10 μm to 60 μm, the bonding rate after the hot-cold cycle was high and a power module substrate having high bond reliability was obtained.

From the above results, it was confirmed that, according to the invention, it is possible to provide a copper-ceramic bonded body (power module substrate) in which the copper member formed of copper or a copper alloy and the ceramic member formed of nitride ceramic are reliably bonded to each other under the conditions of a low temperature.

Example 3

Confirmation experiments performed for confirming effectiveness of the third embodiment of the invention will be described.

TABLE 3

|  | Ceramic substrate | Brazing material | | Active element | |
|---|---|---|---|---|---|
|  |  | composition | Thickness [μm] | Shape | Thickness [μm] |
| Example A14 of the invention | AlN | Cu-50mass % Al | 5 | Ti foil | 25 |
| Example A15 of the invention | AlN | Cu-50mass % Al | 10 | Ti foil | 0.6 |
| Example A16 of the invention | AlN | Cu-68mass % Al | 30 | Ti foil | 6 |
| Example A17 of the invention | AlN | Cu-68mass % Al | 50 | Ti foil | 6 |
| Example A18 of the invention | AlN | Cu-68mass % Al | 70 | Ti foil | 6 |
| Example A19 of the invention | Si$_3$N$_4$ | Cu-80mass % Al | 20 | Ti foil | 10 |
| Example A20 of the invention | Si$_3$N$_4$ | Cu-80mass % Al | 20 | Ti foil | 10 |
| Example A21 of the invention | AlN | Cu-68mass % Al | 20 | Ti vapor deposited film | 0.1 |
| Example A22 of the invention | Si$_3$N$_4$ | Cu-68mass % Al | 20 | Ti vapor deposited film | 0.1 |

TABLE 4

|  | Heating treatment step | | Interface observation results | | | | | |
|---|---|---|---|---|---|---|---|---|
|  | Temperature [° C.] | Time [min] | Bonding interfaces | Thickness of active element oxide layer [nm] | Cu concentration of Cu—Al eutectic layer [at %] | Thickness of Cu—Al eutectic layer [μm] | Bonding rate [%] | |
|  |  |  |  |  |  |  | Initial | After hot-cold cycle |
| Example A14 of the invention | 600 | 30 | Active element oxide layer | 7 | 82.6 | 5 | 98.0 | 90.4 |
| Example A15 of the invention | 620 | 30 | Active element oxide layer | 15 | 76.9 | 10 | 98.7 | 95.2 |
| Example A16 of the invention | 580 | 120 | Active element oxide layer | 15 | 79.2 | 40 | 97.8 | 94.7 |
| Example A17 of the invention | 650 | 60 | Active element oxide layer | 100 | 69.5 | 60 | 98.7 | 95.8 |
| Example A18 of the invention | 650 | 120 | Active element oxide layer | 150 | 83.4 | 90 | 98.6 | 89.7 |
| Example A19 of the invention | 650 | 60 | Active element oxide layer | 90 | 76.6 | 50 | 97.7 | 95.5 |
| Example A20 of the invention | 650 | 90 | Active element oxide layer | 120 | 71.0 | 60 | 98.6 | 94.5 |
| Example A21 of the invention | 650 | 60 | Active element oxide layer | 100 | 81.6 | 40 | 97.5 | 95.0 |
| Example A22 of the invention | 650 | 60 | Active element oxide layer | 100 | 69.7 | 40 | 97.5 | 94.3 |

In Example A14 to Example A22 of the invention in which the thickness of the active element oxide layer is set to be from 5 nm to 220 nm using the Cu—Al-based brazing material, the initial bonding rate was high even under the conditions of a comparatively low temperature and the ceramic substrate and the copper plate were reliably bonded to each other. Particularly, in Example A15 to Example A17 and Example A19 to Example A22 of the invention in which A copper-ceramic bonded body (power module substrate) was formed using a ceramic substrate (MARUWA Co., Ltd.), a brazing material, an active element, and a copper plate shown in Table 5.

More specifically, a copper plate (rolled plate of oxygen-free copper) having a size of 38 mm×38 mm and a thickness of 0.3 mm was laminated on one and the other surfaces of a ceramic substrate having a size of 40 mm×40 mm and a thickness of 0.38 mm with a brazing material and an active element shown in Table 5 interposed therebetween, and these components were charged and heated in a vacuum heating furnace (degree of vacuum of $5 \times 10^{-4}$ Pa) in a state of being pressurized at pressure of 7 kgf/cm² in a laminating direction to manufacture a power module substrate. The conditions of the heating treatment step are shown in Table 6.

In Example B4 of the invention, Cu-7 mass % P-15 mass % Sn-10 mass % Ni powder and paste formed of Ti powder were used as the brazing material and the active element. A coating thickness of the paste was set as 80 µm.

Regarding the power module substrate obtained as described above, the bonding interfaces between the circuit layer (copper plate) and the ceramic substrate were observed and an initial bonding rate and a bonding rate after the hot-cold cycle were evaluated. Each layer shown in the bonding interfaces of Table 6 is the active element oxide layer. Evaluation method was the same as that in Example 1.

Figure 11:
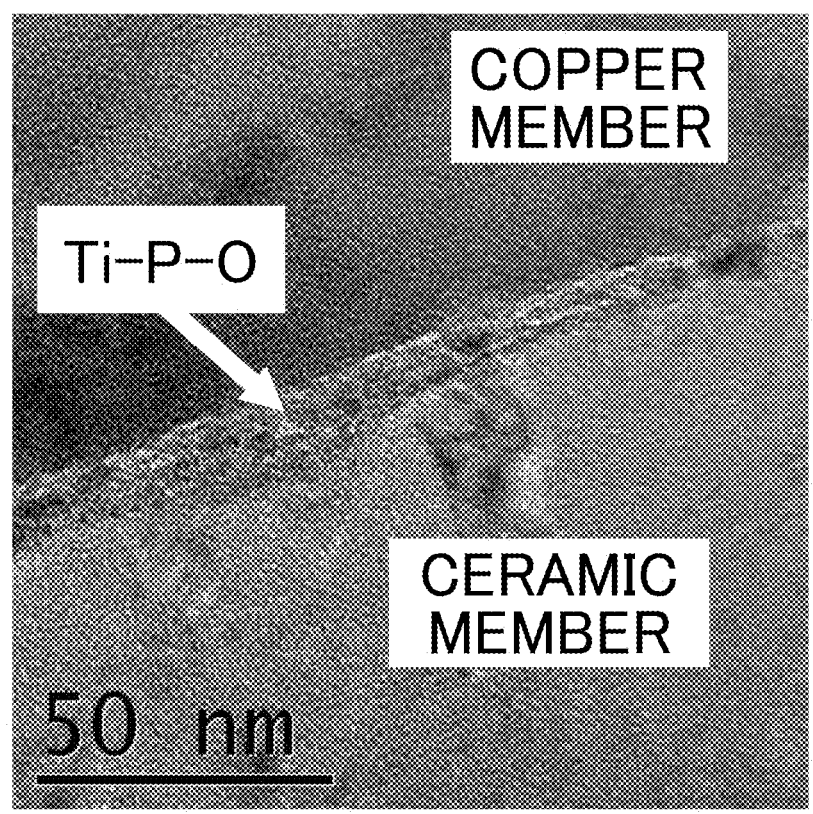
FIG. 11 is an observation image of bonding interfaces of a copper-ceramic bonded body (power module substrate) of Example B2 of the present invention.

The evaluation results are shown in Table 6. The interface observation results of Example B2 of the invention are shown in FIG. 11.

The copper plate and the ceramic substrate were not bonded to each other in Related Art Example B1 in which the copper plate and the ceramic substrate were bonded using a Ag—Cu—Ti brazing material under the conditions of a low temperature.

In Comparative Example B1 in which the thickness of the active element oxide layer is smaller than 5 nm, initial bonding rate was low and the bonding was insufficient.

In Comparative Example B2 in which the thickness of the active element oxide layer exceeds 220 nm, cracks were generated on the ceramic substrate after the hot-cold cycle. It is assumed that the thermal stress applied to the ceramic substrate is increased due to the formation of the thick active element oxide layer at the bonding interfaces.

With respect to this, in Example B1 to Example B1 of the invention in which the thickness of the active element oxide layer is from 5 nm to 220 nm, the initial bonding rate was high even under the conditions of a comparatively low temperature and the ceramic substrate and the copper plate were reliably bonded to each other. In Examples B1 to B6 and B9 to B11 of the invention in which the phosphorous concentration of the active element oxide layer is in a range of 1.5 mass % to 10 mass %, the bonding rate after the

TABLE 5

| | | Brazing material | | Active element | |
|---|---|---|---|---|---|
| | Ceramic substrate | Composition | Thickness [µm] | Shape | Thickness [µm] |
| Example B1 of the invention | 98% alumina | Cu-7mass % P-10mass % Sn-6.5mass % Ni | 20 | Ti foil | 0.5 |
| Example B2 of the invention | 98% alumina | Cu-7mass % P-15mass % Sn-10mass % Ni | 20 | Ti foil | 3 |
| Example B3 of the invention | 98% alumina | Cu-7mass % P-15mass % Sn-10mass % Ni | 20 | Ti foil | 10 |
| Example B4 of the invention | 98% alumina | Brazing material paste•Ti paste | | | |
| Example B5 of the invention | Reinforced alumina | Cu-7mass % P-15mass % Sn-10mass % Ni | 50 | Ti foil | 20 |
| Example B6 of the invention | Reinforced alumina | Cu-7mass % P-15mass % Sn-10mass % Ni | 50 | Ti foil | 25 |
| Example B7 of the invention | 98% alumina | Cu-4mass % P-20mass % Sn-7mass % Ni | 50 | Ti foil | 10 |
| Example B8 of the invention | 98% alumina | Cu-10mass % P-20mass % Sn-7mass % Ni | 50 | Ti foil | 10 |
| Example B9 of the invention | 98% alumina | Cu-7mass % P-15mass % Sn-10mass % Ni | 50 | Zr foil | 5 |
| Example B10 of the invention | 98% alumina | Cu-7mass % P-15mass % Sn-10mass % Ni | 50 | Nb foil | 5 |
| Example B11 of the invention | 98% alumina | Cu-7mass % P-15mass % Sn-10mass % Ni | 50 | Hf foil | 5 |
| Comparative Example B1 | 98% alumina | Cu-7mass % P-15mass % Sn-10mass % Ni | 50 | Ti foil | 20 |
| Comparative Example B2 | 98% alumina | Cu-7mass % P-15mass % Sn-10mass % Ni | 50 | Ti foil | 20 |
| Related Art Example B1 | 98% alumina | Ag-28mass % Cu-3mass % Ti | 20 | — | — |

TABLE 6

| | Heating treatment step | | Interface observation results | | | Bonding rate [%] | |
|---|---|---|---|---|---|---|---|
| | Temperature [° C.] | Time [min] | Bonding interfaces | Thickness [nm] | P concentration | Initial | After hot-cold cycle |
| Example B1 of the invention | 610 | 200 | Ti—P—O layer | 6 | 1.6 | 98.6 | 93.7 |
| Example B2 of the invention | 630 | 30 | Ti—P—O layer | 10 | 2.1 | 98.9 | 94.8 |
| Example B3 of the invention | 630 | 180 | Ti—P—O layer | 100 | 6.4 | 99.3 | 96.8 |
| Example B4 of the invention | 650 | 60 | Ti—P—O layer | 100 | 4.9 | 99.2 | 96.6 |
| Example B5 of the invention | 650 | 30 | Ti—P—O layer | 50 | 3.7 | 99.5 | 95.0 |
| Example B6 of the invention | 650 | 180 | Ti—P—O layer | 200 | 9.4 | 99.7 | 97.1 |
| Example B7 of the invention | 610 | 200 | Ti—P—O layer | 6 | 1.1 | 99.1 | 83.4 |
| Example B8 of the invention | 650 | 180 | Ti—P—O layer | 200 | 14.2 | 98.8 | 84.2 |
| Example B9 of the invention | 650 | 180 | Zr—P—O layer | 220 | 9.6 | 99.6 | 97.2 |
| Example B10 of the invention | 650 | 240 | Nb—P—O layer | 150 | 8.9 | 98.1 | 94.4 |
| Example B11 of the invention | 650 | 240 | Hf—P—O layer | 150 | 9.1 | 98.2 | 93.8 |
| Comparative Example B1 | 650 | 15 | Ti—P—O layer | 3 | 1.0 | 83.4 | 60.1 |
| Comparative Example B2 | 650 | 400 | Ti—P—O layer | 300 | 9.7 | 99.6 | Cracks in 1500 to 2000 |
| Related Art Example B1 | 650 | 30 | — | — | — | — | — | hot-cold cycle was equal to or greater than 90% which was high, and bond reliability was improved.

From the above results, it was confirmed that, according to the invention, it is possible to provide a copper-ceramic bonded body (power module substrate) in which the copper member formed of copper or a copper alloy and the ceramic member formed of alumina are reliably bonded to each other under the conditions of a low temperature.

REFERENCE SIGNS LIST 10, 210: POWER MODULE SUBSTRATE
11, 211: CERAMIC SUBSTRATE
12: CIRCUIT LAYER
13: METAL LAYER
22: COPPER PLATE
24, 224: Cu—P-BASED BRAZING MATERIAL
25, 225: Ti FOIL
30, 130, 230: ACTIVE ELEMENT OXIDE LAYER
131: Cu—Al EUTECTIC LAYER

The invention claimed is:

1. A copper-ceramic bonded body comprising:
a copper member formed of copper or a copper alloy; and
a ceramic member formed of nitride ceramic,
wherein the copper member and the ceramic member are bonded to each other,
wherein an active element oxide layer containing an active element and oxygen is formed at bonding interfaces between the copper member and the ceramic member,
wherein a thickness of the active element oxide layer is in a range of 5 nm to 200 nm
wherein the active element is selected from the group consisting of Ti, Zr, Hf, and Nb,
wherein the active element oxide layer contains P, and
wherein an amount of P of the active element oxide layer is in a range of 1.5 mass % to 10 mass %.

2. The copper-ceramic bonded body according to claim 1,
wherein a Cu—Al eutectic layer is formed between the active element oxide layer and the copper member.

3. A power module substrate configured with the copper-ceramic bonded body according to claim 1,
wherein in the copper-ceramic bonded body, a copper plate formed of copper or a copper alloy is bonded to a surface of a ceramic substrate formed of nitride ceramic.

4. The copper-ceramic bonded body according to claim 1,
wherein a concentration of the active element of the active element oxide layer is in a range of 35% to 70%.

* * * * *